US012448685B2

(12) United States Patent
Yeon et al.

(10) Patent No.: US 12,448,685 B2
(45) Date of Patent: *Oct. 21, 2025

(54) GROWTH INHIBITOR FOR FORMING THIN FILM, METHOD FOR FORMING THIN FILM AND SEMICONDUCTOR SUBSTRATE PREPARED THEREFROM

(71) Applicant: SOULBRAIN CO., LTD., Seongnam-si (KR)

(72) Inventors: Changbong Yeon, Seongnam-si (KR); Jaesun Jung, Seongnam-si (KR); Hyeran Byun, Seongnam-si (KR); Taeho Song, Seongnam-si (KR); Sojung Kim, Seongnam-si (KR); Seokjong Lee, Seongnam-si (KR)

(73) Assignee: SOULBRAIN CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/512,724

(22) Filed: Oct. 28, 2021

(65) Prior Publication Data
US 2022/0049352 A1 Feb. 17, 2022

Related U.S. Application Data

(62) Division of application No. 16/734,415, filed on Jan. 6, 2020.

(30) Foreign Application Priority Data

Aug. 29, 2019 (KR) .................. 10-2019-0106695
Oct. 31, 2019 (KR) .................. 10-2019-0137840

(51) Int. Cl.
*C23C 16/455* (2006.01)
*C07C 17/00* (2006.01)
(Continued)

(52) U.S. Cl.
CPC ........ *C23C 16/45525* (2013.01); *C07C 17/00* (2013.01); *C07C 27/00* (2013.01);
(Continued)

(58) Field of Classification Search
CPC .............. C23C 16/45525; C23C 16/08; C23C 16/4408; C23C 16/45595
See application file for complete search history.

(56) References Cited

U.S. PATENT DOCUMENTS 6,072,225 A * 6/2000 Chang ............... H01L 21/76819
257/466
7,166,528 B2 * 1/2007 Kim .................. H01L 21/02532
438/300
(Continued)

FOREIGN PATENT DOCUMENTS

JP           3953244 B2 *  5/2007  .......... H01L 21/285
JP         2018006753 A    1/2018
(Continued)

OTHER PUBLICATIONS

Sandupatla, Aditya Shankar, et al., "DFT Investigation into Alumina ALD Growth Inhibition on Hydroxylated Amorphous Silica Surface". The Journal of Physical Chemistry C, 2015, 119, 18380-18388.*
(Continued)

*Primary Examiner* — Bret P Chen
(74) *Attorney, Agent, or Firm* — SZDC Law PC

(57) ABSTRACT

Disclosed are a growth inhibitor for forming a thin film, a method for forming a thin film using the same, and a semiconductor substrate prepared therefrom. The growth inhibitor for forming a thin film is represented by Chemical Formula 1: AnBmXo [Chemical Formula 1]. A is carbon or silicon, B is hydrogen or a C1-C3 alkyl, X is a halogen, n is an integer from 1 to 15, o is an integer of 1 or more, and m
(Continued)

is from 0 to 2n+1. It is possible to suppress side reactions to appropriately lower a thin film growth rate and remove process byproducts in the thin film, thereby preventing corrosion or deterioration and greatly improving step coverage and thickness uniformity of a thin film even when the thin film is formed on a substrate having a complicated structure.

6 Claims, 3 Drawing Sheets

(51) Int. Cl.

| | | |
|---|---|---|
| *C07C 27/00* | (2006.01) | |
| *C07C 201/00* | (2006.01) | |
| *C23C 16/08* | (2006.01) | |
| *C23C 16/18* | (2006.01) | |
| *C23C 16/44* | (2006.01) | |

(52) U.S. Cl.
CPC ............ *C07C 201/00* (2013.01); *C23C 16/08* (2013.01); *C23C 16/18* (2013.01); *C23C 16/4408* (2013.01); *C23C 16/45595* (2013.01)

(56) References Cited

U.S. PATENT DOCUMENTS

| | | | | |
|---|---|---|---|---|
| 2003/0168001 | A1* | 9/2003 | Sneh ................. | C23C 16/02 |
| | | | | 117/86 |
| 2005/0054196 | A1* | 3/2005 | Wu .................. | H01L 21/28562 |
| | | | | 257/E21.585 |
| 2005/0106865 | A1* | 5/2005 | Chung .............. | C23C 16/45504 |
| | | | | 438/680 |
| 2007/0099420 | A1* | 5/2007 | Dominguez ...... | C23C 16/45525 |
| | | | | 257/E21.171 |
| 2008/0057690 | A1* | 3/2008 | Forbes .............. | H01L 29/513 |
| | | | | 438/593 |
| 2008/0064205 | A1* | 3/2008 | Dominguez ...... | H01L 21/28556 |
| | | | | 438/653 |
| 2011/0318535 | A1* | 12/2011 | Jung ................. | B82Y 30/00 |
| | | | | 977/773 |
| 2014/0187018 | A1* | 7/2014 | Malhotra .......... | H01L 28/56 |
| | | | | 438/396 |
| 2015/0132953 | A1* | 5/2015 | Nowling ........... | H01L 21/67086 |
| | | | | 438/692 |
| 2015/0376211 | A1* | 12/2015 | Girard .............. | H01L 21/0228 |
| | | | | 556/412 |
| 2016/0089723 | A1* | 3/2016 | Jung ................. | B82Y 40/00 |
| | | | | 204/192.34 |
| 2018/0197773 | A1* | 7/2018 | Amanapu .......... | H01L 23/5226 |
| 2018/0315840 | A1 | 11/2018 | Chui et al. | |
| 2021/0087683 | A1* | 3/2021 | Yeon ................. | H01L 21/0228 |
| 2021/0090892 | A1* | 3/2021 | Yeon ................. | C23C 16/303 |

FOREIGN PATENT DOCUMENTS

| | | | | |
|---|---|---|---|---|
| JP | 2018164079 A | | 10/2018 | |
| KR | 10-2009-0044285 | * | 5/2009 | ............ H01L 21/20 |

OTHER PUBLICATIONS

Avila, Jason R., et al., "Real-Time Observation of Atomic Layer Deposition Inhibition: Metal Oxide Growth on Self-Assembled Alkanethiols". ACS Applied Materials & Interfaces, 2014, 6, 11891-11898.*

Sampson, Matthew D., et al., "Inhibiting Metal Oxide Atomic Layer Deposition: Beyond Zinc Oxide". ACS Applied Materials & Interfaces, 2017, 9, 33429-33436.*

Zytowski, Torsten, et al., "Absolute Rate Constants for the Addition of Methyl Radicals to Alkenes in Solution: New Evidence for Polar Interactions". J. Am. Chem. Soc. 1996, vol. 118, No. 2, 437-439.*

Anacleto, A, Correia, et al., "Atomic layer deposition of tantalum nitride based thin films from cyclopentadienyl type precursor". Thin Solid Films 519 (2010) 367-372.*

De Wildeman, Stefaan, et al., "Growth-substrate dependent dechlorination of 1,2-dichloroethane by a homoacetogenic bacterium". Biodegradation 14: 241-247, 2003, pp. 241-247.*

* cited by examiner

CONVENTIONAL TiCl₄ ALD

<TSI-TiCl₄ ALD>

| SAMPLE | TOP | BOTTOM | STEP COVERAGE(%) |
|---|---|---|---|
| EXAMPLE 1 (SP-TiCl$_4$) | | | 92% |
| COMPARATIVE EXAMPLE 1 (TiCl$_4$) | | | 78% |

GROWTH INHIBITOR FOR FORMING THIN FILM, METHOD FOR FORMING THIN FILM AND SEMICONDUCTOR SUBSTRATE PREPARED THEREFROM

CROSS-REFERENCE TO RELATED APPLICATIONS

This application is a divisional of U.S. application Ser. No. 16/734,415, filed on Jan. 6, 2020, claims priority under 35 U.S.C. § 119 to Korean Patent Application No. 10-2019-0106695, filed on Aug. 29, 2019, and Korean Patent Application No. 10-2019-0137840, filed on Oct. 31, 2019, in the Korean Intellectual Property Office, the disclosures of which are incorporated herein by reference in their entirety.

TECHNICAL FIELD

The following disclosure relates to a growth inhibitor for forming a thin film, a method for forming a thin film using the same, and a semiconductor substrate prepared therefrom, and more particularly, to a growth inhibitor for forming a thin film capable of suppressing side reactions to appropriately lower the thin film growth rate and remove process byproducts in the thin film, thereby preventing corrosion or deterioration and greatly improving step coverage and thickness uniformity of a thin film even when the thin film is formed on a substrate having a complicated structure, a method for forming a thin film using the same, and a semiconductor substrate prepared therefrom.

BACKGROUND

The degree of integration of memory and non-memory semiconductor devices is increasing day by day. As the structure thereof becomes more complicated, the importance of step coverage in depositing various thin films on a substrate is gradually increasing.

A thin film for a semiconductor is made of a metal nitride, metal oxide, metal silicide, or the like. Metal nitride thin films include titanium nitride (TiN), tantalum nitride (TaN), zirconium nitride (ZrN), and the like. Thin films are generally used as a diffusion barrier between the silicon layer of a doped semiconductor and an interlayer wiring material such as aluminum (Al), copper (Cu), or the like. However, when a tungsten (W) thin film is deposited on the substrate, the tungsten (W) thin film is used as an adhesion layer.

In order to obtain a thin film having excellent and uniform physical properties when deposited on the substrate, it is essential that the formed thin film have a high step coverage. Therefore, an atomic layer deposition (ALD) process employing a surface reaction, rather than a chemical vapor deposition (CVD) process mainly employing a gas phase reaction, is utilized; however, there is still a problem to realize 100% step coverage.

In addition, in the case of using titanium tetrachloride ($TiCl_4$) to deposit titanium nitride (TiN), a representative material among the metal nitrides, process by-products such as chlorides remain in the prepared thin film, causing corrosion of metals such as aluminum, and the like, and the production of non-volatile byproducts leads to deterioration of film quality.

Therefore, it is necessary to develop a method for forming a thin film which is capable of forming a thin film having a complicated structure and which does not lead to corrosion of an interlayer wiring material, and to develop a semiconductor substrate prepared therefrom, and the like.

DOCUMENTS OF THE RELATED ART (Patent Document 1) Korean Patent Laid-Open Publication No. 2006-0037241

SUMMARY

An embodiment of the present disclosure is directed to providing a growth inhibitor for forming a thin film capable of suppressing side reactions to appropriately lower the growth rate of the thin film and remove process byproducts therein, thereby preventing corrosion or deterioration and greatly improving the step coverage and thickness uniformity of the thin film even when the thin film is formed on a substrate having a complicated structure, a method for forming a thin film using the same, and a semiconductor substrate prepared therefrom.

All of the above objects and other objects of the present disclosure can be achieved by the present disclosure described below.

To achieve the above-mentioned objects, the present invention provides a growth inhibitor for forming a thin film comprising a compound represented by Chemical Formula 1 below.

$$A_nB_mX_o \qquad \text{[Chemical Formula 1]}$$

wherein A is carbon or silicon, B is hydrogen or a C1-C3 alkyl, X is a halogen, n is an integer from 1 to 15, o is an integer of 1 or more, and m is from 0 to 2n+1.

Further, the present invention provides a method for forming a thin film, comprising a step of injecting the growth inhibitor for forming a thin film into an atomic layer deposition (ALD) chamber and adsorbing the growth inhibitor onto a surface of a loaded substrate.

In addition, the present invention provides a semiconductor substrate prepared by the method for forming a thin film.

DETAILED DESCRIPTION OF EMBODIMENTS

Figure 1:
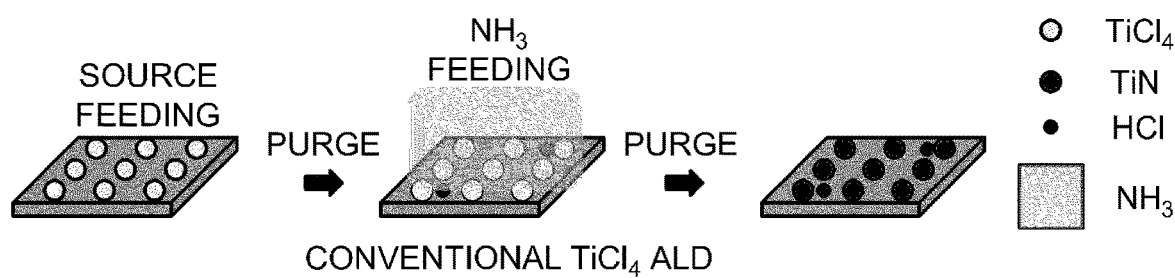
FIG. 1 is a process chart illustrating a conventional atomic layer deposition (ALD) process.

Hereinafter, a growth inhibitor for forming a thin film, a method for forming a thin film using the same, and a semiconductor substrate prepared therefrom are described in detail.

The present inventors found that when a halogen-substituted compound having a predetermined structure is first adsorbed as a growth inhibitor before the adsorption of a thin film precursor compound on a surface of a substrate loaded inside an atomic layer deposition (ALD) chamber, the growth rate of the thin film to be formed after deposition is lowered and a significant reduction of the halides remaining as process byproducts is achieved, thereby greatly improving step coverage, and the like. Based on this finding, the present inventors made a significant effort on further research and thereby completed the present disclosure.

The growth inhibitor for forming a thin film of the present disclosure is characterized by a compound represented by Chemical Formula 1 below:

$$A_nB_mX_o \qquad \text{[Chemical Formula 1]}$$

wherein A is carbon or silicon, B is hydrogen or a C1-C3 alkyl, X is a halogen, n is an integer from 1 to 15, o is an integer of 1 or more, and m is from 0 to 2n+1. In this case, side reactions occurring during formation of the thin film may be suppressed to lower the thin film growth rate while also achieving removal of process byproducts in the thin film, and thus corrosion or deterioration may be reduced and step coverage and thickness uniformity of a thin film may be greatly improved even when the thin film is formed on a substrate having a complicated structure.

In Chemical Formula 1, B is preferably hydrogen or methyl, n is preferably an integer from 2 to 15, more preferably an integer from 2 to 10, even more preferably an integer from 2 to 6, and still more preferably an integer from 4 to 6. Within this range, an effect of removing the process byproduct may be large and excellent step coverage may be achieved.

In Chemical Formula 1, X may be one or more selected from the group consisting of, for example, F, Cl, Br and I, and is preferably Cl (chlorine), in which case side reactions may be suppressed and process by-products may be effectively removed.

In Chemical Formula 1, o may preferably be an integer from 1 to 5, more preferably an integer from 1 to 3, and even more preferably may be 1 or 2. Within this range, an effect of reducing the deposition rate may be large, which is more effective for improving the step coverage.

M is preferably from 1 to 2n+1, and more preferably from 3 to 2n+1. Within this range, the effect of removing the process byproducts may be large and excellent step coverage may be achieved.

The compound represented by Chemical Formula 1 may preferably be a branched, cyclic or aromatic compound, and may be specifically one or more selected from the group consisting of 1,1-dichloroethane, 1,2-dichloroethane, dichloromethane, 2-chloropropane, 1-chloropropane, 1,2-dichloropropane, 1,3-dichloropropane, 2,2-dichloropropane, 1-chloropentane, 2-chloropentane, 3-chloropentane, chlorocyclopentane, n-butylchloride, tert-butyl chloride, sec-butyl chloride, isobutyl chloride, 1,2-dichlorobenzene, 1,4-dichlorobenzene, trimethylchlorosilane, trichloropropane, 2-chloro-2-methylbutane, 2-methyl-1-pentane, and the like. In this case, there are advantages in that the effect of removing the process byproducts is large and excellent step coverage is achieved.

The compound represented by Chemical Formula 1 is preferably used in an atomic layer deposition (ALD) process, and in this case, there are advantages in that the compound acts as a growth inhibitor to effectively protect the surface of the substrate and effectively remove process byproducts without interfering with adsorption of the thin film precursor compound.

The compound represented by Chemical Formula 1 is preferably a liquid at room temperature (22° C.), may have a density of 0.8 to 1.5 g/cm$^3$, a vapor pressure (20° C.) of 1 to 300 mmHg, and solubility in water (25° C.) of 200 mg/L or less. Within this range, excellent step coverage and thickness uniformity may be achieved.

More preferably, the compound represented by Chemical Formula 1 may have a density of 0.85 to 1.3 g/cm$^3$, a vapor pressure (20° C.) of 1 to 260 mmHg, and solubility in water (25° C.) of 160 mg/L or less. Within this range, excellent step coverage and thickness uniformity of the thin film may be achieved.

Further, a method for forming a thin film comprising injecting a growth inhibitor for forming a thin film into an atomic layer deposition (ALD) chamber and adsorbing the growth inhibitor on a surface of a loaded substrate is presented in the present disclosure, the growth inhibitor for forming a thin film being represented by Chemical Formula 1 below:

$$A_nB_mX_o \qquad \text{[Chemical Formula 1]}$$

wherein A is carbon or silicon, B is hydrogen or a C1-C3 alkyl, X is a halogen, n is an integer from 1 to 15, o is an integer of 1 or more, and m is from 0 to 2n+1.

According to the present invention, it is possible to suppress side reactions to appropriately lower the thin film growth rate and remove process byproducts in the thin film, thereby preventing corrosion or deterioration and greatly improving step coverage and thickness uniformity of a thin film even when the thin film is formed on a substrate having a complicated structure.

In the step of adsorbing the growth inhibitor for forming a thin film on the surface of the substrate, the feeding time for the growth inhibitor is preferably 1 to 10 seconds, more preferably 1 to 5 seconds, even more preferably 2 to 5 seconds, and still more preferably 2 to 4 seconds. Within this range, there are advantages in that the thin film growth rate is low, and the step coverage and economic feasibility are excellent.

The feeding time of the growth inhibitor for forming a thin film in the present disclosure is based on a chamber having a volume of 15 to 20 L at a flow rate of 0.5 to 5 mg/s, and more specifically, a chamber having a volume of 18 L at a flow rate of 1 to 2 mg/s.

In one preferred embodiment, the method for forming a thin film may comprise steps of: i) vaporizing the growth inhibitor for forming a thin film and adsorbing the growth inhibitor on a surface of a substrate loaded in an atomic layer deposition (ALD) chamber; ii) primary purging of the inside of the ALD chamber with a purge gas; iii) vaporizing a thin film precursor compound and adsorbing the thin film precursor compound on the surface of the substrate loaded in the ALD chamber; iv) secondary purging of the inside of the ALD chamber with a purge gas; v) supplying a reaction gas into the ALD chamber; and vi) tertiary purging of the inside of the ALD chamber with a purge gas. In this case, there are advantages in that the thin film growth rate is appropriately lowered, the process byproducts which may be generated are effectively removed even if the deposition temperature is increased at the time of formation of the thin film, and thus the specific resistance of the thin film is reduced and the step coverage is greatly improved.

The growth inhibitor for forming a thin film and the thin film precursor compound may preferably be transferred into the ALD chamber by a vapor flow control (VFC) method, a delivery liquid injection (DLI) method or a liquid delivery system (LDS) method, and may more preferably be transferred into the ALD chamber by the LDS method.

The ratio of the feeding amount (mg/cycle) between the growth inhibitor for forming a thin film and the precursor compound in the ALD chamber may preferably be from 1:1.5 to 1:20, more preferably from 1:2 to 1:15, even more preferably from 1:2 to 1:12, and still more preferably from 1:2.5 to 1:10. Within this range, a high reduction rate of the thin film growth rate (GPC) per cycle and a great reduction of the process byproducts may be achieved.

The thin film precursor compound to be employed is not particularly limited as long as it is a thin film precursor compound generally used in the ALD method, but is preferably a metal film precursor compound, a metal oxide film precursor compound, a metal nitride film precursor compound, or a silicon nitride film precursor compound, wherein the metal preferably may comprise one or more selected from the group consisting of tungsten, cobalt, chromium, aluminum, hafnium, vanadium, niobium, germanium, lanthanoids, actinoids, gallium, tantalum, zirconium, ruthenium, copper, titanium, nickel, iridium, and molybdenum.

The metal film precursor, the metal oxide film precursor, and the metal nitride film precursor may each be one or more selected from the group consisting of, for example, a metal halide, a metal alkoxide, an alkyl metal compound, a metal amino compound, a metal carbonyl compound, a substituted or unsubstituted cyclopentadienyl metal compound, and the like, but the precursor is not limited thereto.

As a specific example, the metal film precursor, the metal oxide film precursor, and the metal nitride film precursor may each be one or more selected from the group consisting of tetrachlorotitan, tetrachlorogermanium, tetrchlorotin, tris (isopropyl)ethylmethyl aminogermanium, tetraethoxylgermanium, tetramethyl tin, tetraethyl tin, bisacetylacetonate tin, trimethylaluminum, tetrakis(dimethylamino) germanium, bis(n-butylamino) germanium, tetrakis(ethylmethylamino) tin, tetrakis(dimethylamino) tin, $Co_2(CO)_8$ (dicobalt octacarbonyl), Cp2Co(biscyclopentadienylcobalt), $Co(CO)_3(NO)$ (cobalt tricarbonyl nitrosyl), and CpCo(CO)2 (cobalt dicarbonyl cyclopentadienyl and the like, but the precursor is not limited thereto.

The silicon nitride film precursor, for example, may be one or more selected from the group consisting of $(NH_2)Si(NHMe)_3$, $(NH_2)Si(NHEt)_3$, $(NH_2)Si(NH^nPr)_3$, $(NH_2)Si(NHiPr)_3$, $(NH_2)Si(NH^nBu)_3$, $(NH_2)Si(NHiBu)_3$, $(NH_2)Si(NHtBu)_3$, $(NMe_2)Si(NHMe)_3$, $(NMe_2)Si(NHEt)_3$, $(NMe_2)Si(NH^nPr)_3$, $(NMe_2)Si(NHiPr)_3$, $(NMe_2)Si(NH^nBu)_3$, $(NMe_2)Si(NHiBu)_3$, $(NMe_2)Si(NHtBu)_3$, $(NEt_2)Si(NHMe)_3$, $(NEt_2)Si(NHEt)_3$, $(NEt_2)Si(NH^nPr)_3$, $(NEt_2)Si(NHiPr)_3$, $(NEt_2)Si(NH^nBu)_3$, $(NEt_2)Si(NHiBu)_3$, $(NEt_2)Si(NHtBu)_3$, $(N^nPr_2)Si(NHMe)_3$, $(N^nPr_2)Si(NHEt)_3$, $(N^nPr_2)Si(NH^nPr)_3$, $(N^nPr_2)Si(NHiPr)_3$, $(N^nPr_2)Si(NH^nBu)_3$, $(N^nPr_2)Si(NHiBu)_3$, $(N^nPr_2)Si(NHtBu)_3$, $(N^iPr_2)Si(NHMe)_3$, $(N^iPr_2)Si(NHEt)_3$, $(N^iPr_2)Si(NH^nPr)_3$, $(N^iPr_2)Si(NHiPr)_3$, $(N^iPr_2)Si(NH^nBu)_3$, $(N^iPr_2)Si(NHiBu)_3$, $(N^iPr_2)Si(NHtBu)_3$, $(N^nBu_2)Si(NHMe)_3$, $(N^nBu_2)Si(NHEt)_3$, $(N^nBu_2)Si(NH^nPr)_3$, $(N^nBu_2)Si(NHiPr)_3$, $(N^nBu_2)Si(NH^nBu)_3$, $(N^nBu_2)Si(NHiBu)_3$, $(N^nBu_2)Si(NHtBu)_3$, $(NiBu_2)Si(NHMe)_3$, $(NiBu_2)Si(NHEt)_3$, $(NiBu_2)Si(NH^nPr)_3$, $(NiBu_2)Si(NHiPr)_3$, $(NiBu_2)Si(NH^nBu)_3$, $(NiBu_2)Si(NHiBu)_3$, $(NiBu_2)Si(NHtBu)_3$, $(NtBu_2)Si(NHMe)_3$, $(NtBu_2)Si(NHEt)_3$, $(NtBu_2)Si(NH^nPr)_3$, $(NtBu_2)Si(NHiPr)_3$, $(NtBu_2)Si(NH^nBu)_3$, $(NtBu_2)Si(NHiBu)_3$, $(NtBu_2)Si(NHtBu)_3$, $(NH_2)_2Si(NHMe)_2$, $(NH_2)_2Si(NHEt)_2$, $(NH_2)_2Si(NH^nPr)_2$, $(NH_2)_2Si(NHiPr)_2$, $(NH_2)_2Si(NH^nBu)_2$, $(NH_2)_2Si(NHiBu)_2$, $(NH_2)_2Si(NHtBu)_2$, $(NMe_2)_2Si(NHMe)_2$, $(NMe_2)_2Si(NHEt)_2$, $(NMe_2)_2Si(NH^nPr)_2$, $(NMe_2)_2Si(NHiPr)_2$, $(NMe_2)_2Si(NH^nBu)_2$, $(NMe_2)_2Si(NHiBu)_2$, $(NMe_2)_2Si(NHtBu)_2$, $(NEt_2)_2Si(NHMe)_2$, $(NEt_2)_2Si(NHEt)_2$, $(NEt_2)_2Si(NH^nPr)_2$, $(NEt_2)_2Si(NHiPr)_2$, $(NEt_2)_2Si(NH^nBu)_2$, $(NEt_2)_2Si(NHiBu)_2$, $(NEt_2)_2Si(NHtBu)_2$, $(N^nPr_2)_2Si(NHMe)_2$, $(N^nPr_2)_2Si(NHEt)_2$, $(N^nPr_2)_2Si(NH^nPr)_2$, $(N^nPr_2)_2Si(NHiPr)_2$, $(N^nPr_2)_2Si(NH^nBu)_2$, $(N^nPr_2)_2Si(NHiBu)_2$, $(N^nPr_2)_2Si(NHtBu)_2$, $(N^iPr_2)_2Si(NHMe)_2$, $(N^iPr_2)_2Si(NHEt)_2$, $(N^iPr_2)_2Si(NH^nPr)_2$, $(N^iPr_2)_2Si(NHiPr)_2$, $(N^iPr_2)_2Si(NH^nBu)_2$, $(N^iPr_2)_2Si(NHiBu)_2$, $(N^iPr_2)_2Si(NHtBu)_2$, $(N^nBu_2)_2Si(NHMe)_2$, $(N^nBu_2)_2Si(NHEt)_2$, $(N^nBu_2)_2Si(NH^nPr)_2$, $(N^nBu_2)_2Si(NHiPr)_2$, $(N^nBu_2)_2Si(NH^nBu)_2$, $(N^nBu_2)_2Si(NH^iBu)_2$, $(N^nBu_2)_2Si(NHMe)_2$, $(N^iBu_2)_2Si(NHEt)_2$, $(N^iBu_2)_2Si(NH^nPr)_2$, $(N^iBu_2)_2Si(NHiPr)_2$, $(N^iBu_2)_2Si(NH^nBu)_2$, $(N^iBu_2)_2Si(NH^iBu)_2$, $(NtBu_2)_2Si(NHMe)_2$, $(NtBu_2)_2Si(NHEt)_2$, $(N^tBu_2)_2Si(NH^nPr)_2$, $(N^tBu_2)_2Si(NH^iPr)_2$, $(N^tBu_2)_2Si(NH^nBu)_2$, $(N^tBu_2)_2Si(NH^iBu)_2$, $(N^tBu_2)_2Si(NH^tBu)_2$, $Si(HNCH_2CH_2NH)_2$, $Si(MeNCH_2CH_2NMe)_2$, $Si(EtNCH_2CH_2NEt)_2$, $Si(^nPrNCH_2CH_2N^nPr)_2$, $Si(^iPrNCH_2CH_2N^iPr)_2$, $Si(^nBuNCH_2CH_2N^nBu)_2$, $Si(^iBuNCH_2CH_2N^iBu)_2$, $Si(^tBuNCH_2CH_2N^tBu)_2$, $Si(HNCHCHNH)_2$, $Si(MeNCHCHNMe)_2$, $Si(EtNCHCHNEt)_2$, $Si(^nPrNCHCHN^nPr)_2$, $Si(^iPrNCHCHN^iPr)_2$, $Si(^nBuNCHCHN^nBu)_2$, $Si(^iBuNCHCHN^iBu)_2$, $Si(^tBuNCHCHN^tBu)_2$, $(HNCHCHNH)Si(HNCH_2CH_2NH)$, $(MeNCHCHNMe)Si(MeNCH_2CH_2NMe)$, $(EtNCHCHNEt)Si(EtNCH_2CH_2NEt)$, $(^nPrNCHCHN^nPr)Si(^nPrNCH_2CH_2N^nPr)$, $(^iPrNCHCHN^iPr)Si(^iPrNCH_2CH_2N^iPr)$, $(^nBuNCHCHN^nBu)Si(^nBuNCH_2CH_2N^nBu)$, $(^iBuNCHCHN^iBu)Si(^iBuNCH_2CH_2N^iBu)$, $(^tBuNCHCHN^tBu)Si(^tBuNCH_2CH_2N^tBu)$, $(NH^tBu)_2Si(HNCH_2CH_2NH)$, $(NH^tBu)_2Si(MeNCH_2CH_2NMe)$, $(NH^tBu)_2Si(EtNCH_2CH_2NEt)$, $(NH^tBu)_2Si(^nPrNCH_2CH_2N^nPr)$, $(NH^tBu)_2Si(^iPrNCH_2CH_2N^iPr)$, $(NH^tBu)_2Si(^nBuNCH_2CH_2N^nBu)$, $(NH^tBu)_2Si(^iBuNCH_2CH_2N^iBu)$, $(NH^tBu)_2Si(^tBuNCH_2CH_2N^tBu)$, $(NH^tBu)_2Si(HNCHCHNH)$, $(NH^tBu)_2Si((MeNCHCHNMe)$, $(NH^tBu)_2Si(EtNCHCHNEt)$, $(NH^tBu)_2Si(^nPrNCHCHN^nPr)$, $(NH^tBu)_2Si(^iPrNCHCHN^iPr)$, $(NH^tBu)_2Si(^nBuNCHCHN^nBu)$, $(NH^tBu)_2Si(^iBuNCHCHN^iBu)$, $(NH^tBu)_2Si(^tBuNCHCHN^tBu)$, $(^iPrNCH_2CH_2N^iPr)Si(NHMe)_2$, $(^iPrNCH_2CH_2N^iPr)Si(NHEt)_2$, $(^iPrNCH_2CH_2N^iPr)Si(NH^nPr)_2$, $(^iPrNCH_2CH_2N^iPr)Si(NH^iPr)_2$, $(^iPrNCH_2CH_2N^iPr)Si(NH^nBu)_2$, $(^iPrNCH_2CH_2N^iPr)Si(NH^iBu)_2$, $(^iPrNCH_2CH_2N^iPr)Si(NH^tBu)_2$, $(^iPrNCHCHN^iPr)Si(NHMe)_2$, $(^iPrNCHCHN^iPr)Si(NHEt)_2$, $(^iPrNCHCHN^iPr)Si(NH^nPr)_2$, $(^iPrNCHCHN^iPr)Si(NH^iPr)_2$, $(^iPrNCHCHN^iPr)Si(NH^nBu)_2$, $(^iPrNCHCHN^iPr)Si(NH^iBu)_2$, $(^iPrNCHCHN^iPr)Si(NH^tBu)_2$, but is not limited thereto.

In the above, "Pr means n-propyl, $^i$Pr means isopropyl, "Bu means n-butyl, $^i$Bu means iso-butyl, and $^t$Bu means tert-butyl.

In one preferred embodiment, the thin film precursor compound may be titanium tetrahalide.

The titanium tetrahalide may be used as the metal precursor of a composition for forming a thin film. The titanium tetrahalide may be at least one selected from the group consisting of $TiF_4$, $TiCl_4$, $TiBr_4$, and $TiI_4$, and for example, from an economic standpoint may preferably be $TiCl_4$, but the titanium tetrahalide is not limited thereto.

Since the titanium tetrahalide does not decompose at room temperature but exists in a liquid state due to having excellent thermal stability, the titanium tetrahalide may be usefully employed for the deposition of a thin film as the precursor of ALD.

As an example, the thin film precursor compound may be mixed with a non-polar solvent and injected into the chamber. In this case, there is an advantage in that the viscosity or vapor pressure of the thin film precursor compound may be easily adjusted.

The non-polar solvent may preferably be one or more selected from the group consisting of alkanes and cycloalkanes. In this case, there is an advantage in that even when comprising an organic solvent having low reactivity and solubility with easy moisture management capability, the step coverage is improved even if the deposition temperature is increased during the thin film formation.

In a more preferred embodiment, the non-polar solvent may comprise a C1 to C10 alkane or a C3 to C10 cycloalkane, and preferably a C3 to C10 cycloalkane. In this case, there are advantages in that the reactivity and solubility are low and moisture management may be easily achieved.

In the present disclosure, the notations C1, C3, and the like, represent the number of carbons.

The cycloalkane may preferably be a C3 to C10 monocycloalkane. Among the monocycloalkanes, cyclopentane is liquid at room temperature and has the highest vapor pressure, which is preferable in the vapor deposition process, but the solvent is not limited thereto.

The non-polar solvent has, for example, a solubility in water (25° C.) of 200 mg/L or less, preferably 50 to 200 mg/L, and more preferably 135 to 175 mg/L. Within this range, there are advantages in that the reactivity for the thin film precursor compound is low and moisture management may be easily performed.

In the present disclosure, the method employed for the measurement of solubility is not particularly limited as long as the method or standards thereof correspond to those generally used in the art to which the present disclosure pertains, and for example, a saturated solution may be measured by a high performance liquid chromatography (HPLC) method.

The non-polar solvent may preferably be included at a ratio of 5 to 95 wt %, more preferably 10 to 90 wt %, even more preferably 40 to 90 wt %, and most preferably 70 to 90 wt %, based on the total weight of the thin film precursor compound and the non-polar solvent.

Injection of the non-polar solvent at a content exceeding the upper limit described above may cause impurities, thereby increasing resistance and number of impurities in the thin film, while injection at a content below the lower limit may cause the effect of improvement of the step coverage and reduction of impurities such as chlorine (Cl) ions, to be obtained through addition of the solvent, to be small.

In the method for forming a thin film, for example, the reduction rate of a thin film growth rate (Å/cycle) per cycle calculated by Equation 1 below may be −5% or less, preferably −10% or less, more preferably −20% or less, even more preferably −30% or less, still more preferably −40% or less, and most preferably −45% or less. Within this range, excellent step coverage and film thickness uniformity may be achieved.

Reduction rate of thin film growth rate per cycle (%)=[(thin film growth rate per cycle when growth inhibitor for forming thin film is used−thin film growth rate per cycle when growth inhibitor for forming thin film is not used)/thin film growth rate per cycle when growth inhibitor for forming thin film is not used]×100   Equation 1

In the method for forming a thin film, the residual halogen intensity (c/s) of the thin film formed after 200 cycles, which is measured based on SIMS, may preferably be 10,000 or less, more preferably 8,000 or less, even more preferably 7,000 or less, and still more preferably 6,000 or less. Within this range, excellent prevention of corrosion and deterioration may be achieved.

In the present disclosure, the purging is preferably performed at 1,000 to 10,000 sccm, more preferably at 2,000 to 7,000 sccm, and still more preferably at 2,500 to 6,000 sccm. Within this range, the thin film growth rate per cycle may be reduced to a desirable range and the process byproducts may be reduced.

The atomic layer deposition (ALD) process is very beneficial to preparation of an integrated circuit (IC) that requires a high aspect ratio, and particularly has advantages such as excellent step conformality and uniformity, precise thickness control, and the like, due to the self-limiting thin film growth mechanism.

The method for forming a thin film may be performed, for example, at a deposition temperature in the range of 50 to 900° C., preferably at a deposition temperature in the range of 300 to 700° C., more preferably at a deposition temperature in the range of 350 to 600° C., even more preferably at a deposition temperature in the range of 400 to 550° C., and still more preferably at a deposition temperature in the range of 400 to 500° C. Within this range, it is possible to achieve growth of a thin film with excellent film quality while implementing the ALD process characteristics.

The method for forming a thin film may be performed, for example, at a deposition pressure in the range of 0.1 to 10 Torr, preferably at a deposition pressure in the range of 0.5 to 5 Torr, and most preferably at a deposition pressure in the range of 1 to 3 Torr. Within this range, it is possible to obtain a thin film having uniform thickness.

In the present disclosure, the deposition temperature and the deposition pressure may be measured as the temperature and pressure to be formed in the deposition chamber, or may be measured as the temperature and pressure to be applied to the substrate in the deposition chamber.

The method for forming a thin film may preferably comprise steps of raising the temperature in the chamber to a deposition temperature before the injection of the growth inhibitor for forming a thin film into the chamber; and/or injection and purging of an inert gas into the chamber before the injection of the growth inhibitor for forming a thin film.

In addition, the present disclosure may include an apparatus for preparing a thin film capable of implementing the method for forming a thin film described in the present disclosure, the apparatus for preparing a thin film comprising an atomic layer deposition (ALD) chamber, a first vaporizer for vaporizing the growth inhibitor for forming a thin film, a first transfer unit for transferring the vaporized growth inhibitor into the ALD chamber, a second vaporizer for vaporizing a Ti-based thin film precursor, and a second transfer unit for transferring the vaporized Ti-based thin film precursor into the ALD chamber. Here, the vaporizer and the transfer unit to be employed are not particularly limited as long as they are generally used in the art to which the present disclosure pertains.

As a specific example, the method for forming a thin film is described as follows.

First, the substrate on which the thin film is to be formed is placed in a deposition chamber capable of atomic layer deposition.

The substrate may comprise a semiconductor substrate such as a silicon substrate, silicon oxide, or the like.

The substrate may further comprise a conductive layer or an insulating layer formed thereon.

In order to deposit the thin film on the substrate placed in the deposition chamber, the above-described growth inhibitor for forming a thin film, and the thin film precursor compound or a mixture of the thin film precursor compound and the non-polar solvent are prepared, respectively.

Then, the prepared inhibitor for forming a thin film is injected into the vaporizer and converted into a vapor phase, transferred to the deposition chamber, and then adsorbed on the substrate, after which the remaining unadsorbed inhibitor is purged.

Next, the prepared thin film precursor compound or a mixture of the thin film precursor compound and the non-polar solvent is injected into the vaporizer and converted into a vapor phase, transferred to the deposition chamber, and then adsorbed on the substrate, after which the unadsorbed composition for forming a thin film is purged.

In the present disclosure, as the method employed for transferring the inhibitor for forming a thin film, the thin film precursor compound, and the like, to the deposition chamber may be, for example, a vapor flow control (VFC) method for transferring a volatilized gas through utilization of a mass flow controller (MFC), or a liquid delivery system (LDS) method for transferring a liquid through utilization of a liquid mass flow controller (LMFC), and preferably, the LDS method may be employed.

Here, as a transfer gas or diluent gas for moving the inhibitor for forming a thin film, the thin film precursor compound, and the like, onto the substrate, one or a mixture of two or more gases selected from argon (Ar), nitrogen ($N_2$), and helium (He) may be used, but the gas is not limited thereto.

In the present disclosure, the purge gas may be, for example, an inert gas, and preferably, the transfer gas or dilution gas above.

Next, the reaction gas is supplied. The reaction gas is not particularly limited as long as it is a reaction gas generally used in the art to which the present disclosure pertains, and may preferably comprise a reducing agent, a nitriding agent, or an oxidizing agent. A metal thin film is formed through reaction of the reducing agent with the thin film precursor compound adsorbed on the substrate, while a metal nitride thin film is formed through reaction of the nitriding agent and a metal oxide thin film is formed through reaction of the oxidizing agent.

Preferably, the reducing agent may be ammonia gas ($NH_3$) or hydrogen gas ($H_2$), the nitriding agent may be nitrogen gas ($N_2$), and the oxidizing agent may be one or more selected from the group consisting of $H_2O$, $H_2O_2$, $O_2$, $O_3$, and $N_2O$.

Next, the unreacted residual reaction gas is purged by using the inert gas. Thus, not only the excess reaction gas but also any generated byproducts may be removed together.

As described above, a unit cycle may be determined to comprise steps of adsorbing the inhibitor for forming a thin film on the substrate, purging the unadsorbed inhibitor for forming a thin film, adsorbing the thin film precursor compound on the substrate, purging the unadsorbed composition for forming a thin film, supplying a reaction gas, and purging the residual reaction gas. The unit cycle may be repeated to form a thin film having a desired thickness.

The unit cycle may be performed, for example, from 100 to 1000 times, preferably 100 to 500 times, and more preferably 150 to 300 times. Within this range, the desired thin film characteristics may be well expressed.

Figure 2:
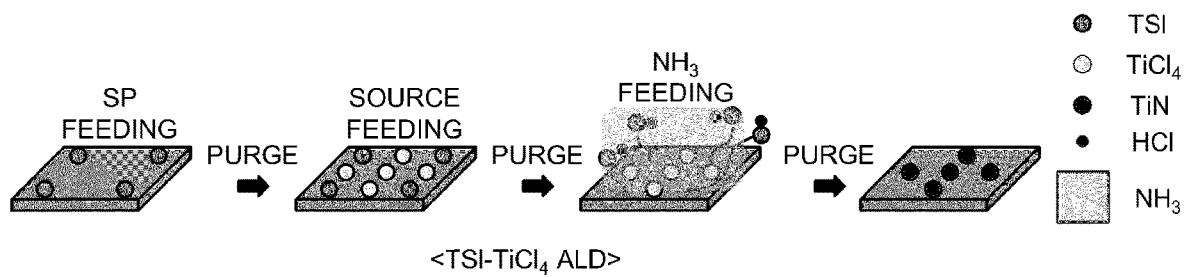
FIG. 2 is a flowchart illustrating an ALD process according to an embodiment of the present disclosure.

FIG. 1 is a process chart illustrating the conventional ALD process and FIG. 2 is a flowchart illustrating the ALD process according to an embodiment of the present disclosure. Referring to FIG. 1, as in the conventional ALD process, when protection of the surface of the substrate is not achieved by first adsorbing the growth inhibitor for forming a thin film according to the present disclosure before adsorption of the thin film precursor compound (e.g., $TiCl_4$), process by-products such as HCl remain in the thin film (for example, TiN) due to reaction with the reaction gas (for example, $NH_3$), and thus the performance of the substrate is lowered due to corrosion or deterioration. However, as shown in FIG. 2, when the surface of the substrate is protected (achieving surface protection; SP) by first adsorbing the growth inhibitor (TSI) for forming a thin film according to the present disclosure before adsorption of the thin film precursor compound (e.g., $TiCl_4$), the process by-products such as HCl generated through reaction with the reaction gas (e.g., $NH_3$) at the time of formation of the thin film (e.g., TiN) are removed together with the growth inhibitor for forming a thin film, thereby preventing corrosion or deterioration of the substrate and further appropriately lowering the thin film growth rate per cycle to improve the step coverage and film thickness uniformity.

The semiconductor substrate of the present disclosure is characterized by being prepared by the method for forming a thin film of the present disclosure, and in this case, it is possible to appropriately lower the thin film growth rate and also remove process byproducts in the thin film by suppressing side reactions, thereby preventing corrosion or deterioration and greatly improving the step coverage and thickness uniformity of the thin film.

The prepared thin film preferably has a thickness of 20 nm or less, a specific resistance value of 0.1 to 400 $\mu\Omega\cdot cm$, a halogen content of 10,000 ppm or less, and a step coverage of 90% or more. Within this range, the prepared thin film may have excellent performance as a diffusion barrier film, and the corrosion of a metal wiring material may be reduced, but the present disclosure not limited thereto.

The thin film may have, for example, a thickness of 5 to 20 nm, preferably 10 to 20 nm, even more preferably 15 to 18.5 nm, and still more preferably 17 to 18.5 nm. Within this range, the thin film may have excellent characteristics.

The thin film may have a specific resistance value of, for example, 0.1 to 400 $\mu\Omega\cdot cm$, preferably 50 to 400 $\mu\Omega\cdot cm$, more preferably 200 to 400 $\mu\Omega\cdot cm$, even more preferably 300 to 400 $\mu\Omega\cdot cm$, still more preferably 330 to 380 $\mu\Omega\cdot cm$, and most preferably 340 to 370 $\mu\Omega\cdot cm$. Within this range, the thin film may have excellent characteristics.

The thin film may have a halogen content of more preferably 9,000 ppm or less, or 1 to 9,000 ppm; even more preferably 8,500 ppm or less, or 100 to 8,500 ppm; and still more preferably 8,200 ppm or less, or 1,000 to 8,200 ppm. Within this range, the thin film may have excellent characteristics and the corrosion of the metal wiring material may be reduced.

The thin film may have, for example, step coverage of 80% or more, preferably 90% or more, and more preferably 92% or more. Within this range, even if a thin film has a complicated structure, the thin film is capable of being easily deposited on the substrate, thereby enabling application to a next generation semiconductor device.

The prepared thin film may be, for example, a TiN thin film or a $TiO_2$ thin film.

Hereinafter, preferable Examples of the present disclosure will be described in order to facilitate understanding of the present disclosure. However, it will be apparent to those skilled in the art that the following Examples are provided only to illustrate the present disclosure, various changes and modifications can be made within the spirit and the scope of the disclosure, and these variations and modifications are included within the scope of the appended claims.

EXAMPLES

Examples 1 to 7

A growth inhibitor for forming a thin film, shown in Table 1 below, and $TiCl_4$ as a thin film precursor compound were prepared, respectively. The prepared growth inhibitor for forming a thin film was placed in a canister and supplied to a vaporizer heated at 150° C. at a flow rate of 0.05 g/min using a liquid mass flow controller (LMFC) at room temperature. The vaporized growth inhibitor for forming a thin film, converted into the vapor phase in the vaporizer, was injected into a deposition chamber loaded with a substrate for 3 seconds, after which argon purging was performed by supplying argon gas at 3000 sccm for 6 seconds. Here, the pressure in the reaction chamber was controlled to be 1.3 Torr. Next, the prepared $TiCl_4$ was placed in a separate canister and supplied to a separate vaporizer heated at 150° C. at a flow rate of 0.05 g/min using an LMFC at room temperature. The vaporized $TiCl_4$' converted to the vapor phase in the vaporizer, was injected into the deposition chamber for 3 seconds, after which argon purging was performed by supplying argon gas at 3000 sccm for 6 seconds. Here, the pressure in the reaction chamber was controlled to be 1.3 Torr. Next, ammonia as a reaction gas was injected into the reaction chamber for 5 seconds, and then argon purging was performed for 10 seconds. Here, the substrate on which a metal thin film was to be formed was heated to 460° C. This process was repeated 200 times to form a TiN thin film as a self-limiting atomic layer.

TABLE 1

| | Growth inhibitor for forming a thin film |
|---|---|
| Example 1 | 2-chloro-2-methylbutane |
| Example 2 | n-butyl chloride |
| Example 3 | trimethylchlorosilane |
| Example 4 | 2-chloropropane |
| Example 5 | 1,2,3-trichloropropane |
| Example 6 | 2-methyl-1-pentane |
| Example 7 | 1,2-dichlorobenzene |

Comparative Example 1

A TiN thin film was formed on a substrate in the same manner as in Example 1, except that the growth inhibitor for forming a thin film was not employed and thus the step of purging the unadsorbed growth inhibitor for forming a thin film was omitted.

Comparative Examples 2 and 3

A TiN thin film was formed on a substrate in the same manner as in Example 1, except that pentane or cyclopentane was used instead of the growth inhibitor for forming a thin film described in Table 1 above.

Experimental Example

1) Deposition Evaluation

As shown in Table 2 below, Example 1 in which chloro-2-methylbutane was used as the growth inhibitor for forming a thin film was compared with Comparative Example 1 in which the growth inhibitor for forming a thin film was not included. As a result, the deposition rate in Example 1 was 0.20 Å/cycle, which represents over a 55.5% reduction when compared with the deposition rate of Comparative Example 1. It could be confirmed that Examples 2 to 7 also had deposition rates similar to that of Example 1. Further, it could be confirmed that Comparative Examples 2 and 3 using pentane or cyclopentane instead of the growth inhibitor for forming a thin film according to the present disclosure also had the same deposition rate as that of Comparative Example 1. Here, the reduction in deposition rate means that the CVD deposition characteristics are changed to ALD deposition characteristics, and thus may be used as an index for improvement of the step coverage characteristics.

TABLE 2

| | Growth Inhibitor | Deposition Rate (Å/cycle) |
|---|---|---|
| Example 1 | 2-chloro-2-methylbutane | 0.20 |
| Example 2 | n-butyl chloride | 0.31 |
| Example 3 | trimethylchlorosilane | 0.28 |
| Example 4 | 2-chloropropane | 0.20 |
| Example 5 | 1,2,3-trichloropropane | 0.32 |
| Example 6 | 2-methyl-1-pentane | 0.28 |
| Example 7 | 1,2-dichlorobenzene | 0.30 |
| Comparative Example 1 | X | 0.45 |
| Comparative Example 2 | Pentane | 0.45 |
| Comparative Example 3 | Cyclopentane | 0.45 |

In addition, as shown in Table 3, it could be confirmed that the deposition rate was continuously reduced according to the feeding amount of chloro-2-methylbutane, the growth inhibitor for forming a thin film. Here, Example 1-1 was performed in the same manner as in Example 1, except for the feeding amount of the growth inhibitor for forming a thin film per cycle.

TABLE 3

| | Comparative Example 1 | Example 1 | Example 1-1 |
|---|---|---|---|
| Feeding amount per ALD cycle (mg/cycle) | 0 | 1.6 | 3.2 |
| Deposition rate (Å/cycle) | 0.45 | 0.20 | 0.02 |

2) Impurity Reduction Characteristics

SIMS analysis was performed to compare the impurity reduction characteristics, that is, the process byproduct reduction characteristics, of the TiN thin films deposited in Example 1 and Comparative Example 1, the results of which are shown in Table 4 below.

TABLE 4

|  | Example 1 | Comparative Example 1 |
| --- | --- | --- |
| Feeding amount per ALD cycle (mg/cycle) | 1.6 | 0 |
| Cl intensity (c/s) | 5907.05 | 17270.25 |

As shown in Table 4, it could be confirmed that the impurities of Example 1 in which the growth inhibitor for forming a thin film according to the present disclosure was employed were reduced to about ⅓ in comparison to Comparative Example 1 in which the growth inhibitor was not employed.

Figure 3:
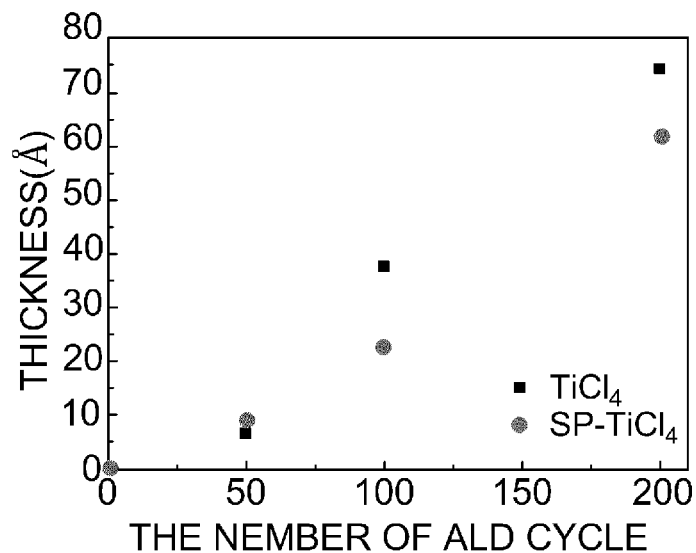
FIG. 3 is a graph illustrating the change in thin film thickness according to the increase in ALD cycle for Example 7 (SP—$TiCl_4$) and Comparative Example 1 ($TiCl_4$) of the present disclosure.

Further, FIG. 3 is a graph showing the change in thickness of the thin film according to the increase in atomic layer deposition (ALD) cycle of Example 7 (SP—TiCl$_4$) and Comparative Example 1 (TiCl$_4$) of the present disclosure, wherein it could be confirmed that the thickness of the thin film in Example 7 became significantly thinner.

Figure 4:
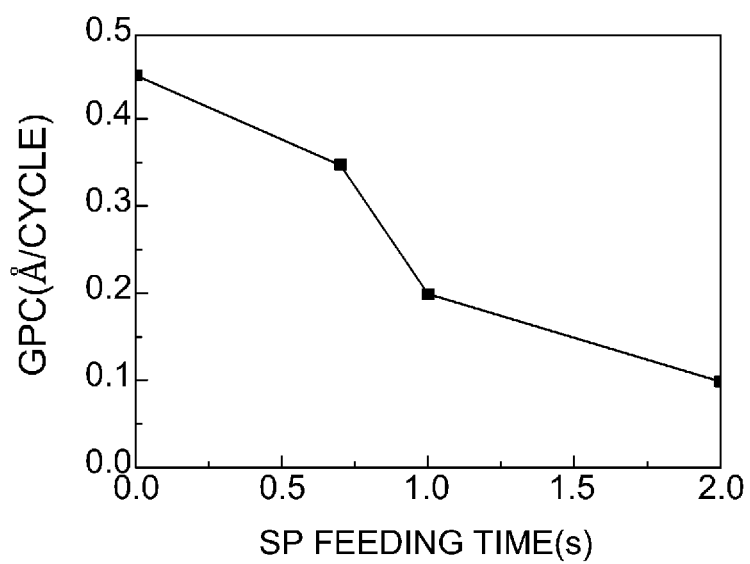
FIG. 4 is a graph illustrating the change in thin film thickness according to feeding amount of growth inhibitor (SP) for forming a thin film per ALD cycle for Examples 7-1 to 7-3 and Comparative Example 1 of the present disclosure.

In addition, FIG. 4 is a graph illustrating the change in thin film thickness according to the feeding amount of a growth inhibitor (SP) for forming a thin film per ALD cycle of Examples 7-1 to 7-3 and Comparative Example 1 of the present disclosure, wherein it could be confirmed that when the inhibitor for forming a thin film according to the present disclosure was not used, as in Comparative Example 1, the thin film had a thickness of 74 Å, whereas in Examples 7-1, 7-2, and 7-3 in which the growth inhibitor for forming a thin film according to the present disclosure was injected in an amount of 0.7 mg, 1 mg, and 2 mg, respectively, the thin film thickness was significantly thinned to 0.35 Å, 0.2 Å, and 0.1 Å, respectively. Here, Examples 7-1, 7-2, and 7-3 were performed in the same manner as in Example 7, except for the feeding amount of the growth inhibitor for forming a thin film.

3) Step Coverage Characteristics

Step coverage of TiN thin films deposited in Example 1 and Comparative Example 1 were confirmed by TEM, the results of which are shown in Table 5 below and FIG. 5.

TABLE 5

|  | Example 1 | Comparative 1 |
| --- | --- | --- |
| Step coverage rate (%) | 92% | 78% |

As shown in Table 5, it could be confirmed that the step coverage of Example 1 in which the growth inhibitor for forming a thin film according to the present disclosure was employed was significantly higher than that of Comparative Example 1 in which the growth inhibitor was not employed.

Figures 5, 6:
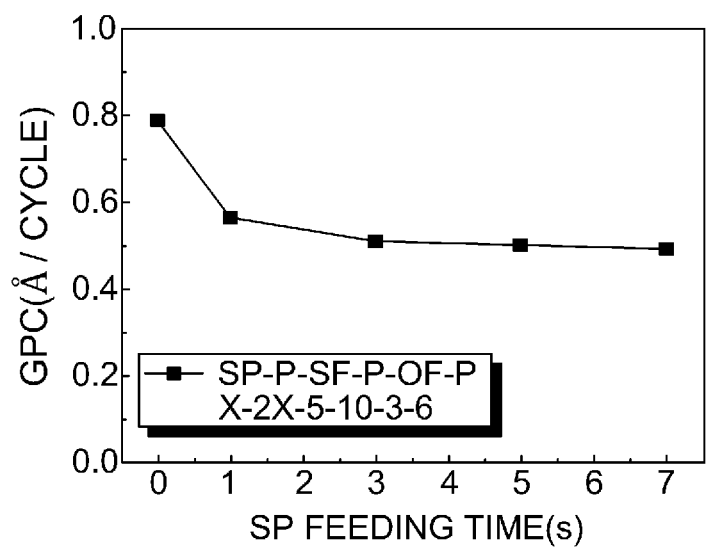
FIG. 5 illustrates transmission electron microscope (TEM) images of TIN thin films deposited for Example 1 (SP—$TiCl_4$) and Comparative Example 1 ($TiCl_4$) of the present disclosure.
FIG. 6 is a graph illustrating the change in deposition rate (Å/cycle) according to feeding time (s) of a growth inhibitor (SP) for forming a thin film per ALD cycle for Additional Example 2 and Additional Comparative Example 1 of the present disclosure.

In addition, referring to the TEM images shown in FIG. 5, it could be confirmed that in view of the thickness uniformity of the top and bottom, step conformality of the TiN thin film deposited in Example 1 (SP—TiCl$_4$) was more excellent as compared to the TiN thin film deposited in Comparative Example (TiCl$_4$).

Additional Example 1

A zirconium oxide film (ZrO$_2$ thin film) was formed by the same method as in Example 1 above, except that tris(dimethylamino)cyclopentadienyl zirconium (CpZr) was used as a film precursor instead of TiCl$_4$, the growth inhibitor for forming a thin film was injected into the chamber at an amount of 12 mg/sec, ozone was used as a reaction gas instead of ammonia, and the substrate on which the metal thin film was to be formed was heated to 280 to 340° C.

Additional Example 2

A zirconium oxide film (ZrO$_2$ thin film) was formed by the same method as in Additional Example 1, except that the growth inhibitor for forming a thin film was injected into the chamber at an amount of 2.3 mg/sec for 1 to 7 seconds, respectively, and the substrate on which the metal thin film was to be formed was heated to 310° C.

Additional Comparative Example 1

A zirconium oxide film (ZrO$_2$ thin film) was formed by the same method as in Additional Example 1, except that the growth inhibitor for forming a thin film was not employed.

The deposition rate, reduction rate (%), and thickness uniformity (%) were measured for the zirconium oxide films deposited in Additional Examples 1 and 2 and Additional Comparative Example 1, the results of which are shown in Table 6 below and FIG. 6. Here, the thickness uniformity (%) was calculated by Equation 2, as follows:

$$\text{Thickness uniformity (\%)} = [(\text{MAX}-\text{MIN})/(2*\text{AVERAGE})]*100\% \quad \text{[Equation 2]}$$

wherein the MAX, MIN, and AVERAGE represent the maximum value, the minimum value, and the average value of the thickness, and each optical thickness was measured using ellipsometer equipment.

TABLE 6

|  |  | Temp (° C.) | | | | | | |
| --- | --- | --- | --- | --- | --- | --- | --- | --- |
|  |  | 280 | 290 | 300 | 310 | 320 | 330 | 340 |
| Additional Example 1 | SP-CpZr (Å/cycle) | 0.510 | 0.508 | 0.510 | 0.510 | 0.510 | 0.511 | 0.510 |
|  | reduction rate (%) | 34.6 | 35.5 | 35.9 | 36.1 | 36.6 | 40.1 | 42.3 |
|  | Uniformity (%) | 1.1 | 2.1 | 1.6 | 1.5 | 1.7 | 1.5 | 1.8 |
| Additional Comparative Example 1 | CpZr (Å/cycle) | 0.781 | 0.788 | 0.796 | 0.798 | 0.805 | 0.854 | 0.884 |
|  | Uniformity (%) | 1.4 | 1.1 | 1.2 | 1.6 | 3.1 | 4.3 | 3.8 |

As shown in Table 6, in the zirconium oxide film (Additional Example 1) formed by using the growth inhibitor for forming a thin film according to the present disclosure, as compared to the zirconium oxide film (Additional Comparative Example 1) formed without employment of the growth inhibitor according to the present disclosure, it could be confirmed that the thin film thickness per ALD cycle according to the deposition temperature was very constant at 0.508 to 0.511 Å, while simultaneously, the reduction rate was greatly reduced to the range of 34.6 to 42.3%, and further, the film thickness uniformity was in the range of 1.1 to 2.1%, indicating a very small fluctuation range.

Further, FIG. 6 is a graph illustrating the change in deposition rate (Å/cycle) according to the feeding time (s) of the growth inhibitor (SP) for forming a thin film per ALD cycle of Additional Example 2 and Additional Comparative Example 1 of the present disclosure, wherein it could be confirmed that when the inhibitor for forming a thin film according to the present disclosure was not employed, as in Additional Comparative Example 1, the deposition rate per cycle was about 0.8 Å/cycle, whereas in Additional Example 2 in which the growth inhibitor for forming a thin film according to the present disclosure was injected for 1 second, 3 seconds, 5 seconds, and 7 seconds, respectively, the deposition rate was significantly lowered to about 0.56 Å/cycle, 0.52 Å/cycle, 0.51 Å/cycle, and 0.50 Å/cycle, respectively. Here, SP—P—SF—P—OF—P means 1 cycle comprising injection of the growth inhibitor (SP) for forming a thin film, injection of purge gas (P), injection of thin film precursor (SF), injection of purge gas (P), injection of reaction gas (OF), and injection of purge gas (F), X-2X-5-10-3-6 means the feeding time S of each step, and X is an integer of 0 to 7.

As set forth above, according to the present disclosure, it is possible to provide a growth inhibitor for forming a thin film capable of suppressing side reactions and reducing a deposition rate to appropriately lower a thin film growth rate while also removing process byproducts in the thin film, thereby preventing corrosion or deterioration and greatly improving step coverage and thickness uniformity of the thin film even when the thin film is formed on a substrate having a complicated structure, a method for forming a thin film using the same, and a semiconductor substrate prepared therefrom.

What is claimed is:

1. A method for forming a thin film comprising:
   i) vaporizing a growth inhibitor for forming a thin film, injecting the growth inhibitor into an atomic layer deposition (ALD) chamber, and adsorbing the growth inhibitor on a surface of a substrate loaded in the atomic layer deposition (ALD) chamber;
   ii) primary purging of an inside of the ALD chamber with a purge gas;
   iii) vaporizing a thin film precursor compound and adsorbing the thin film precursor compound on the surface of the substrate loaded in the ALD chamber;
   iv) secondary purging of the inside of the ALD chamber with a purge gas;
   v) supplying a reaction gas into the ALD chamber; and
   vi) tertiary purging of the inside of the ALD chamber with a purge gas, wherein a unit cycle comprises steps i) to vi) and is repeated to form the thin film,
   wherein a ratio of the feeding amount (mg/cycle) between the growth inhibitor for forming a thin film and the precursor compound in the ALD chamber is 1:1.5 to 1:20,
   wherein the growth inhibitor for forming a thin film is one or more selected from the group consisting of 1,1-dichloroethane, 1,2-dichloroethane, dichloromethane, 2-chloropropane, 1-chloropropane, 1,2-dichloropropane, 1,3-dichloropropane, 2,2-dichloropropane, 1-chloropentane, 2-chloropentane, 3-chloropentane, chlorocyclopentane, n-butylchloride, tert-butyl chloride, sec-butyl chloride, isobutyl chloride, 1,2-dichlorobenzene, 1,4-dichlorobenzene, trimethylchlorosilane, trichloropropane, 2-chloro-2-methylbutane, and 2-methyl-1-pentane, and
   wherein the feeding amount of the growth inhibitor is 0.5-50 mg/cycle.

2. The method for forming a thin film of claim 1, wherein the growth inhibitor for forming a thin film and the thin film precursor compound are transferred into the ALD chamber by a vapor flow control (VFC) method.

3. The method for forming a thin film of claim 1, wherein a reduction rate of a thin film growth rate per cycle (Å/cycle) calculated by the following Equation 1 is -5% or less:

Reduction rate of thin film growth rate per cycle (%)=[(thin film growth rate per cycle when growth inhibitor for forming thin film is used−thin film growth rate per cycle when growth inhibitor for forming thin film is not used)/thin film growth rate per cycle when growth inhibitor for forming thin film is not used]×100. [Equation 1]

4. The method for forming a thin film of claim 1, wherein a residual halogen intensity (c/s) in the thin film formed after 200 cycles, which is measured based on Secondary Ion Mass Spectrometry, is 10,000 or less.

5. The method for forming a thin film of claim 1, wherein the reaction gas is a reducing agent, a nitriding agent, or an oxidizing agent.

6. The method for forming a thin film of claim 1, wherein a deposition temperature is in the range of 300 to 700° C., and a deposition pressure is in the range of 0.5 to 5 Torr.

* * * * *